(12) United States Patent
Lim et al.

(10) Patent No.: US 6,588,098 B1
(45) Date of Patent: Jul. 8, 2003

(54) METHOD FOR MANUFACTURING AN ELECTRONIC DEVICE PACKAGE

(75) Inventors: Boon Huat Lim, Johor (MY); Saat Shukri Embong, Terrengganu (MY); Kevin J. Theseira, Singapore (SG); Kenneth Teik Kheong Low, Singapore (SG)

(73) Assignee: Semiconductor Components Industries LLC, Phoenix, AZ (US)

( * ) Notice: Subject to any disclaimer, the term of this patent is extended or adjusted under 35 U.S.C. 154(b) by 408 days.

(21) Appl. No.: 09/710,786

(22) Filed: Nov. 13, 2000

(51) Int. Cl.[7] .................................................. H05K 3/30
(52) U.S. Cl. ............................. 29/841; 29/856; 29/771
(58) Field of Search ....................... 29/832, 841, 854, 29/855, 856, 848, 771; 257/777, 778, 782, 783, 787, 788; 438/106, 108, 124, 126, 127; 222/1, 63, 144.5, 257, 262; 174/52.2, 52.3

(56) References Cited

U.S. PATENT DOCUMENTS

| | | | | |
|---|---|---|---|---|
| 6,098,278 A | * | 8/2000 | Vindasius et al. | 29/830 |
| 6,329,832 B1 | * | 12/2001 | Cobbley et al. | 324/765 |
| 6,399,425 B1 | * | 6/2002 | Brand et al. | 438/126 |
| 6,408,510 B1 | * | 6/2002 | Hembree | 29/841 |
| 6,441,473 B1 | * | 8/2002 | Deshmukh | 257/669 |
| 6,519,844 B1 | * | 2/2003 | Nagarajan et al. | 29/841 |
| 2002/0148110 A1 | * | 10/2002 | Blanc et al. | 29/831 |

* cited by examiner

*Primary Examiner*—Timothy V. Eley

(57) ABSTRACT

A system for manufacturing electronic device packages includes a conveyor with an adhesive work surface to support a predetermined array of external connectors for flip-chip bonding of dies thereto. After assembly, the dies with associated external connectors bonded thereto are encapsulated on a work surface of the conveyor whereby the work surface forms at least part of an inner surface of an encapsulating mold.

3 Claims, 1 Drawing Sheet

METHOD FOR MANUFACTURING AN ELECTRONIC DEVICE PACKAGE

FIELD OF THE INVENTION

This invention is concerned with an assembly line and method for manufacturing an electronic device package. The invention is particularly although not exclusively concerned with the combination of a flip-chip die bonding apparatus with a lead conveyor wherein device packages can be encapsulated as individual units.

BACKGROUND OF THE INVENTION

In currently employed processes for automated assembly of electronic device packages it is customary to form an array of electrical conductors or leads from a perforated copper foil strip to form a peripheral lead frame to support the individual leads in a predetermined spatial array to facilitate robotic placement and bonding of semiconductor dies to the leads. The peripheral lead frame is then severed to leave an encapsulated die package with an array of leads protruding therefrom.

One such prior art process utilizes a continuous reel of copper foil strip, perforated at spaced intervals to form lead arrays, as a conveyor means for semiconductor dies bonded to respective lead arrays as the dies proceed through various steps of an automated package assembly line. The final step in such a process is the severing of the leads from the lead frame strip to enable individual packages to be adhesively mounted, for example on a Mylar strip at spaced intervals for subsequent handling in an automated assembly process.

While generally effective for its intended purpose, such a prior art process for assembling electronic device packages is cost inefficient as only a very small proportion of the copper lead frame/conveyor strip is actually employed in a package.

BRIEF DESCRIPTION OF THE DRAWINGS

In order that the invention may be more fully understood and put into practical effect, reference will now be made to a preferred embodiment illustrated in the accompanying drawing in which.

DETAIL DESCRIPTION OF THE DRAWINGS

Figure 1:
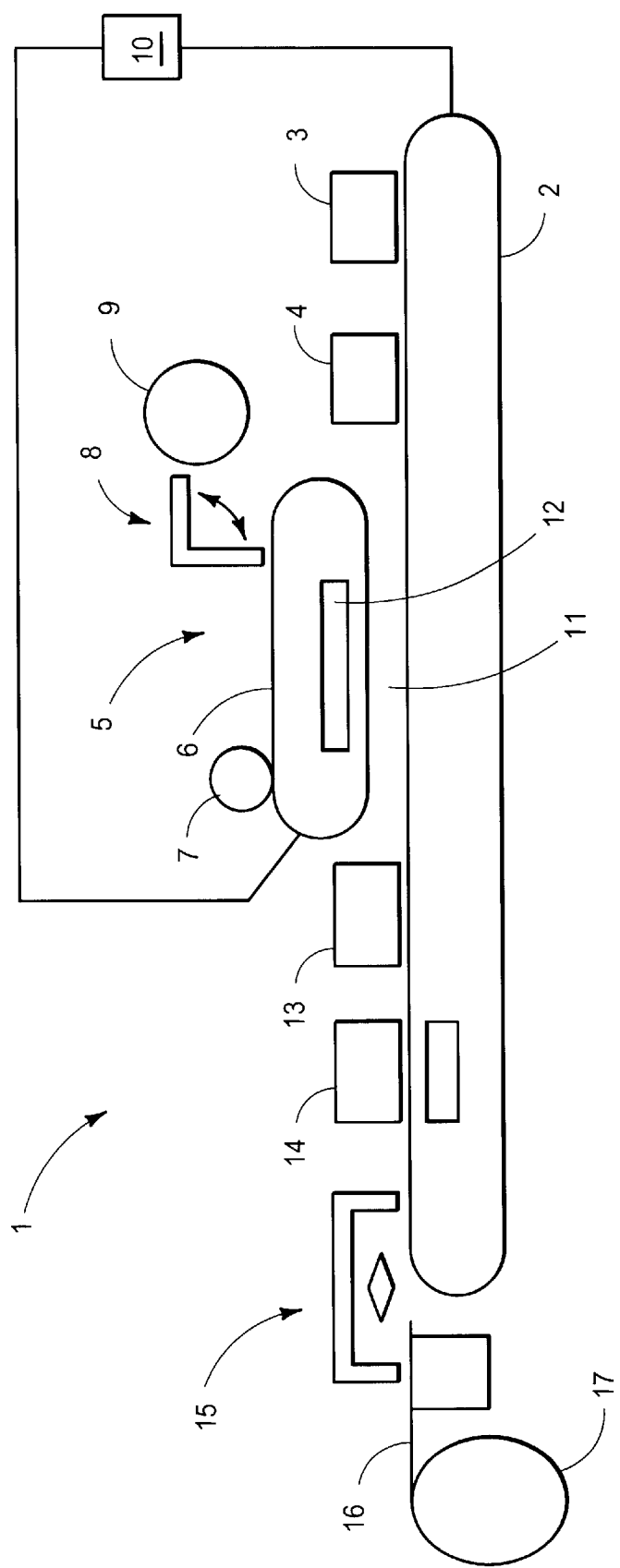
FIG. 1 is a schematic illustration of an assembly line for manufacture of electronic device packages.

FIG. 1 shows schematically an assembly line for manufacture of electronic device packages according to the invention. The assembly line 1 comprises a conveyor 2 in the form of an endless belt having an adhesive or tacky surface thereon for location of a predetermined array of external connectors of a device package during the initial assembly steps. An external connector dispenser 3 places a predetermined array or pattern of external connectors on to the surface of conveyor 2 where the adhesive or tacky surface retains the external connectors sufficiently to allow subsequent processing steps but nevertheless allows removal of a completed device package without damage.

The predetermined array of external connectors then passes under a bonding material dispenser 4 which dispenses a quantity of bonding material such as epoxy resin in paste or tape form onto selected regions of the external connectors. The array of external connectors then passes to a semiconductor die mounter 5 comprising an endless belt 6, an adhesive dispenser 7, a die pick and place apparatus 8.

Die pick and place apparatus 8 selectively removes individual dies from a die supporter 9 which may be, for example, a sliced wafer supported on an adhesive substrate, and places the dies into contact with a layer of adhesive on belt 6.

Drive motors of conveyor 2 and endless belt 6 are synchronized by a controller 10 whereby as endless belt 6 operates, it brings external electrodes of a die adhered thereto into registry with the adhesive coated external connectors on the surface of conveyor 2. The distance between the lower surface of belt 6 and the upper surface of conveyor 2 is such that the die and registered array of external connectors is sandwiched under slight pressure as they move between the gap 11 between belt 6 and conveyor 2. Associated with belt 6 is an ultra-violet curing station 12 which irradiates the adhesive layer between the die and belt 6 to cross-link or partially cross-link the UV sensitive adhesive to reduce its adhesive properties.

As the die/external connector emerges downstream from gap 12 between belt 6 and conveyor 2, the adhesion between the die and the belt is reduced to a point where the degree of adhesion between the die/external connect array and conveyor 2 exceeds that of the adhesive bond with belt 6 and the die/external connector array is released from belt 6 without disturbance. As belt 6 continues to rotate, adhesive dispenser 7 applies fresh adhesive for subsequent contact with a die to be placed by pick and place apparatus. The die/external connector array then passes to a bonding station 13 for curing the epoxy adhesive between the die and the external connectors. Typically, bonding station 13 includes a source of infra red radiation such as heated gas, electrical heating elements or the like. Thereafter, the die, with bonded external connectors passes to a molding station 14 which encapsulates the die whilst the external connectors are in intimate contact with the upper work surface of conveyor 2 whereby at least the lower contact surface of the external connectors remains exposed for subsequent electrical connection. In other words, the work surface of conveyor 2 forms at least part of the surface of a die encapsulating mold.

After the encapsulation process is completed, the encapsulated die progresses to a further pick and place apparatus 15 which removes the encapsulated dies from the work surface of conveyor 2 and places them on an adhesive tape 16 at a predetermined spacing before being wound on to a storage reel 17. The apparatus and method described above are particularly suitable for flip-chip die bonding and give rise to substantial advantages over prior art systems for semiconductor die packaging.

The apparatus and method according to the invention offer significant advantages over prior art processes in materials cost savings by eliminating the need for lead frames, greater tolerance controls and reduced labor overheads in operating and maintaining manufacturing equipment. A further advantage arises in the encapsulation process wherein the work surface of the conveyor functions as at least part of the internal surface of the encapsulation die. This, together with the avoidance of continuous lead frame strips, enables the step of singulation or separation of individual die packages.

What is claimed is:

1. A method for manufacturing an electronic device package, comprising:

dispensing a pre-determined array of external connectors onto a conveyor work surface with an adhesive thereon;

dispensing a bonding material onto said external connectors;

mounting a die onto said external connectors, wherein external electrodes of said die abut said bonding material on respective said external connectors;

effecting a chemical reaction to said bonding material to thereby bond said external electrodes to respective said external connectors; and encapsulating said die with an encapsulating material whilst said external connectors are on said work surface.

2. A method as claimed in claim 1 wherein the step of mounting is further characterized by the steps of placing said die onto a dispensing continuous belt with an adhesive on a dispensing surface thereof, said dispensing continuous belt being synchronized with said conveyor to align said die with said predetermined a ray of external connectors.

3. A method as claimed in claim 2 where n the step of mounting is still further characterized by deactivating an adhesive bond between said die and said dispensing surface prior to separation of said die and said dispensing surface.

* * * * *